(12) United States Patent  
Thornton et al.

(10) Patent No.: US 8,030,764 B2  
(45) Date of Patent: Oct. 4, 2011

(54) HIGH TEMPERATURE OPERATING PACKAGE AND CIRCUIT DESIGN

(75) Inventors: Neill Thornton, Corvallis, OR (US); Dennis Lang, Orange, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 16 days.

(21) Appl. No.: 12/419,696

(22) Filed: Apr. 7, 2009

(65) Prior Publication Data

US 2009/0189678 A1 Jul. 30, 2009

Related U.S. Application Data

(63) Continuation of application No. 11/512,860, filed on Aug. 30, 2006, now abandoned.

(51) Int. Cl.  
*H01L 23/34* (2006.01)

(52) U.S. Cl. .. 257/723; 257/724; 257/725; 257/E23.023

(58) Field of Classification Search .................. 257/723, 257/724, 725, E23.023  
See application file for complete search history.

(56) References Cited

U.S. PATENT DOCUMENTS

| | | | |
|---|---|---|---|
| 7,119,445 B2 * | 10/2006 | Hashimoto | 257/777 |
| 7,271,477 B2 * | 9/2007 | Saito et al. | 257/686 |
| 2001/0054771 A1 * | 12/2001 | Wark et al. | 257/786 |
| 2002/0024124 A1 * | 2/2002 | Hashimoto | 257/678 |
| 2003/0116859 A1 * | 6/2003 | Hashimoto | 257/777 |
| 2004/0173914 A1 * | 9/2004 | Kurihara et al. | 257/778 |
| 2004/0188706 A1 * | 9/2004 | Chang et al. | 257/177 |
| 2005/0023652 A1 * | 2/2005 | Hashimoto | 257/666 |
| 2005/0179123 A1 * | 8/2005 | Mock et al. | 257/696 |
| 2005/0224945 A1 * | 10/2005 | Saito et al. | 257/686 |
| 2006/0017150 A1 * | 1/2006 | Zingher et al. | 257/688 |
| 2006/0284320 A1 * | 12/2006 | Hashimoto | 257/777 |
| 2007/0057284 A1 * | 3/2007 | Casey et al. | 257/177 |
| 2007/0241393 A1 * | 10/2007 | Hauenstein | 257/328 |
| 2007/0262387 A1 * | 11/2007 | Nonaka et al. | 257/356 |
| 2008/0017966 A1 * | 1/2008 | Williams et al. | 257/686 |
| 2008/0203575 A1 * | 8/2008 | Thomas et al. | 257/762 |
| 2008/0246130 A1 * | 10/2008 | Carney et al. | 257/675 |
| 2009/0115048 A1 * | 5/2009 | Zhao et al. | 257/690 |
| 2009/0236708 A1 * | 9/2009 | Shi et al. | 257/675 |
| 2009/0269884 A1 * | 10/2009 | Drost et al. | 438/108 |

* cited by examiner

*Primary Examiner* — Ngan Ngo  
(74) *Attorney, Agent, or Firm* — Thomas R. FitzGerald, Esq.; Hiscock & Barclay, LLP

(57) ABSTRACT

The invention provides a semiconductor device that is thermally isolated from the printed circuit board such that the device operates at a higher temperature and radiates heat away from the printed circuit board. In another embodiment, the semiconductor is stacked onto a second device and optionally thermally isolated from the second device.

12 Claims, 3 Drawing Sheets

HIGH TEMPERATURE OPERATING PACKAGE AND CIRCUIT DESIGN

CROSS-REFERENCE TO RELATED APPLICATIONS

This application is a continuation of U.S. patent application Ser. No. 11/512,860 filed Aug. 30, 2006.

FIELD OF THE INVENTION

This invention relates to semiconductor devices and packages therefor designed to operate at high temperatures. The invention further relates to the stacking of power switching semiconductor devices.

BACKGROUND OF THE INVENTION

Conventionally, packages for semiconductor devices, such as power devices or integrated circuits, are designed to conduct the heat generated by the device to the printed circuit board (PCB). The heat is conducted through the die pad and the leads to the PCB, which dissipates the heat. High power devices, however, may operate at temperatures that may be out of the safe temperature range of the PCB. For example, silicon carbide (SiC) has desirable properties for high power devices, though SiC-based devices may operate at over 200° C. Typically, a PCB is kept at temperatures below 100° C. Therefore, a package that may operate at high temperatures without significantly affecting the PCB is desired.

In certain cases, high power semiconductor devices provide good switching at high voltages, though they may be less effective at preventing leakage when the device is deactivated. For example, as described above, SiC is known to have desirable switching properties in high-voltage devices; however, SiC devices tend to leak current more readily than is desirable. Therefore, a circuit design that prevents leakage in high power devices and allows a high temperature device to be used without significantly affecting other devices is desired.

SUMMARY OF THE INVENTION

The invention comprises, in one form thereof, a circuit design and a package for semiconductor devices that reduces thermal conduction to the printed circuit board (PCB) in order to radiate the heat generated by the device away from the PCB. In one embodiment, the package is configured with the die pad at the top of the package, facing away from the PCB. The terminals of the die are electrically connected to the leads, which are located proximate to the PCB, via bond wires with low thermal conductivity. The die, the die pad, and the bond wires are encapsulated in a thermally resistant material that has a high thermal impedance as compared to certain metals, such as copper. Since the die is substantially thermally isolated from the PCB, the die operates at a high temperature and radiates heat away from the PCB. In a second embodiment, a high temperature power device is stacked on a second power device with a high thermal resistance layer therebetween. The circuit is configured such that the second power device is turned on before the high temperature device and turned off just after. This is accomplished by using a common gate drive and setting the threshold voltage of the second device to be lower than the threshold voltage of the high temperature device. Alternatively, a gate timing circuit is used to control the switches.

More particularly, the invention includes a packaged semiconductor device, comprising an encapsulant having a top surface and a bottom surface, the encapsulant comprising a thermally resistant material; a die having a first surface and a second surface and being embedded in the encapsulant proximate to the top surface; a plurality of leads engaging the encapsulant proximate the bottom surface; and a die pad embedded in the top surface of the encapsulant. The die pad includes a die attach surface in engagement with the second surface of the die and at least one surface that is exposed by said encapsulant. The die attach surface of the die pad may be in electrical communication with the second surface of the die, which may be a field effect transistor with one or more drain terminals on the second surface. Alternatively, the die may be an integrated circuit. In a particular embodiment, the die is comprised of silicon carbide. The leads are connected to a printed circuit board such that the bottom surface of the encapsulant is proximate the printed circuit board.

In another form, the invention includes a method for forming a package for a semiconductor device having a high temperature operation. The method comprises the steps of providing a semiconductor die attached to a die pad and vertically displaced from a plurality of leads; electrically connecting each of said leads to a terminal on said die via bond wires; encapsulating the die, the bond wires, at least a portion of the die pad, and at least a portion of the leads in a thermally resistant material; and attaching the leads to a circuit, which may comprise a printed circuit board, such that the die and the die pad are displaced from the circuit and substantially thermally isolated from the circuit. The die may be a field effect transistor having a drain terminal in electrical communication with the die pad, or, alternatively, the die is an integrated circuit. Further, the die may comprise silicon carbide.

In another form, the invention includes a circuit having a thermally isolated semiconductor device. The circuit comprises a first semiconductor die having a first die top surface and a first die bottom surface; a second semiconductor die having a second die top surface and a second die bottom surface, the first die bottom surface being attached to the second die top surface; a thermal resistance layer which could be a die attachment material situated between the first die and the second die; and a die pad having a die attach surface engaging the second die bottom surface. In a particular embodiment, each of the first die and the second die are a field effect transistor wherein: the first die comprises a first die source terminal and a first die gate terminal on the first die top surface and a first die drain terminal on the first die bottom surface; and the second die comprises a second die source terminal and a second die gate terminal on the second die top surface and a second die drain terminal on the second die bottom surface. Further, the thermal resistance layer is electrically conductive such that the first die drain terminal is in electrical communication with the second die source terminal to connect the first die and the second die in series. Even further, the first die gate terminal and the second die gate terminal are in electrical communication with a common gate drive and the second die has a lower threshold voltage than the first die. Alternatively the first die gate terminal and the second die gate terminal are electrically connected to a gate timing circuit for controlling the activation and the deactivation of the first die and the second die. The thermal resistance layer may be an electrically conductive epoxy, a tungsten layer, or another suitable material that is thermally resistant and electrically conductive. The first die may comprise silicon carbide and the second die may comprise silicon. In an alternative embodiment, at least one of the first die and the second die may be an integrated circuit.

In yet another form, the invention includes a method for providing a semiconductor power device with current leakage prevention. The method comprises the steps of providing a first field effect transistor (FET) die with a first FET gate terminal and a first FET source terminal on a first FET top surface and a first FET drain terminal on a first FET bottom surface; providing a second FET die with a second FET gate terminal and a second FET source terminal on a second FET top surface and a second FET drain terminal on a second FET bottom surface, wherein the second FET has a lower threshold voltage that the first FET; attaching the first FET die to the second FET die with an electrically conductive thermal resistance layer therebetween such that the first FET drain terminal is in electrical communication with the second FET source terminal; and affixing the second FET die to a die pad. The method may further comprise the step of connecting the first FET gate terminal and the second FET gate terminal to a common gate drive.

In still another form, the invention includes a circuit comprising a plurality of semiconductor power devices configured in a stack and connected in series. The circuit may further comprise a thermal resistance layer between at least two of the plurality of semiconductor power devices. One or more of the semiconductor power devices may be field effect transistors and one or more of the semiconductor power devices may comprise silicon carbide.

An advantage of the present invention is that the package provides a poor thermal path to the circuit board causing the device to operate at a higher temperature and to radiate heat away from the PCB. A further advantage of the invention is that it provides a high power switch stacked on top of and connected in series with another switch that controls the leakage current of the high power switch. Because the switches are separated by a thermal resistance layer, the high voltage device operates at a higher temperature without affecting the low temperature devices including the second switch and the PCB.

BRIEF DESCRIPTION OF THE DRAWINGS

The present invention is disclosed with reference to the accompanying drawings, wherein.

Corresponding reference characters indicate corresponding parts throughout the several views. The examples set out herein illustrate several embodiments of the invention but should not be construed as limiting the scope of the invention in any manner.

DETAILED DESCRIPTION

Figure 1:
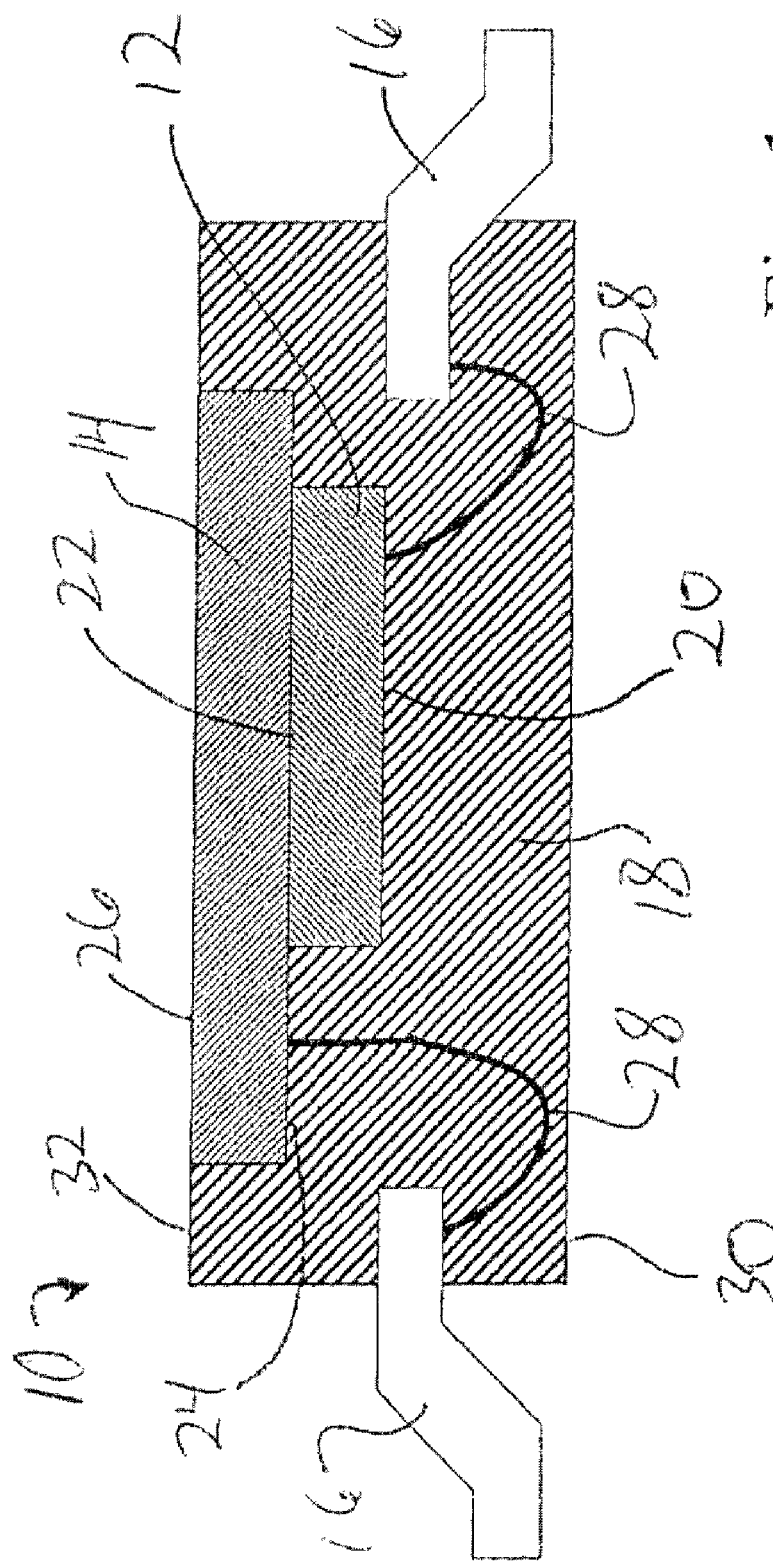
FIG. 1 is a sectional view of the high temperature operating package of the first embodiment of the present invention.

Referring to FIG. 1, there is shown the high temperature operating package of the present invention. The package 10 includes a semiconductor die 12, a die pad 14, a plurality of leads 16, and an encapsulant 18.

As shown in FIG. 1, the die 12 is a semiconductor power device such as a field effect transistor. The invention, however, may be applied to any semiconductor device including an integrated circuit. The die 12 is made of any semiconductor material, however, silicon carbide (SiC) has been shown to have good performance characteristics at high temperatures. In the illustrated configuration, a first surface 20 of the die 12 includes terminals for the gate and the source and a second surface 22 includes one or more terminals for the drain. The second surface 22 is attached to a die attach surface 24 of the die pad 14 such as with an electrically conductive epoxy, solder, or another suitable method that provides electrical communication between the one or more drain terminals of the second surface 22 and the die attach surface 24. Several leads 16 are vertically spaced from the die 12 and the die pad 14, and wire bonds 28 electrically connect each of the leads 16 to one of the gate terminals, the source terminals, or the die pad 12, which is in communication with the drain terminal.

The encapsulant 18 has a bottom surface 30 and a top surface 32 and is a material that has both a high electrical and thermal resistance in comparison to the metal components. A thermally resistant material, as used herein, is a material with a substantially higher thermal impedance than certain metals, such as copper. The leads 16 are proximate the bottom surface 30 such that the bottom surface 30 is proximate to the printed circuit board (PCB) when the leads 16 are connected to the PCB. The die pad 14 is situated at the top surface 32 with an exposed surface 26 uncovered by the encapsulant 18. The encapsulant material between the die 12 and the leads 16 and the PCB provides a poor thermal path from the die to the PCB. It should be noted that the bond wires 28 are thin and also provide a poor thermal path between the die 12 and the leads 16.

In construction, the leads 16 and the die pad 14 may be provided in a lead frame that is separated after encapsulation. Also, the package 10 may be provided in a leadless configuration wherein the leads 16 are enclosed by the encapsulant 18 with one or more exposed surfaces.

In use, the leads 16 provide electrical communication between the PCB and the terminals of the die 12 via the wire bonds 28. The poor thermal path of the encapsulant 18, however, thermally isolates the die 12 and the die pad 14 from the leads 16 and thus from the PCB. Because the heat generated by the operation of the die 12 is not dissipated by the PCB, the die 12 operates at a high temperature. In the case that the die 12 is an SiC device, the temperature may be as high as 200° C. or more. Since the die 12 is thermally isolated from the PCB, the PCB is not damaged by the elevated temperature. Heat is conducted from the die 12 to the die pad 14 and then radiated away from the package 10 via the exposed surface 26.

Figure 2:
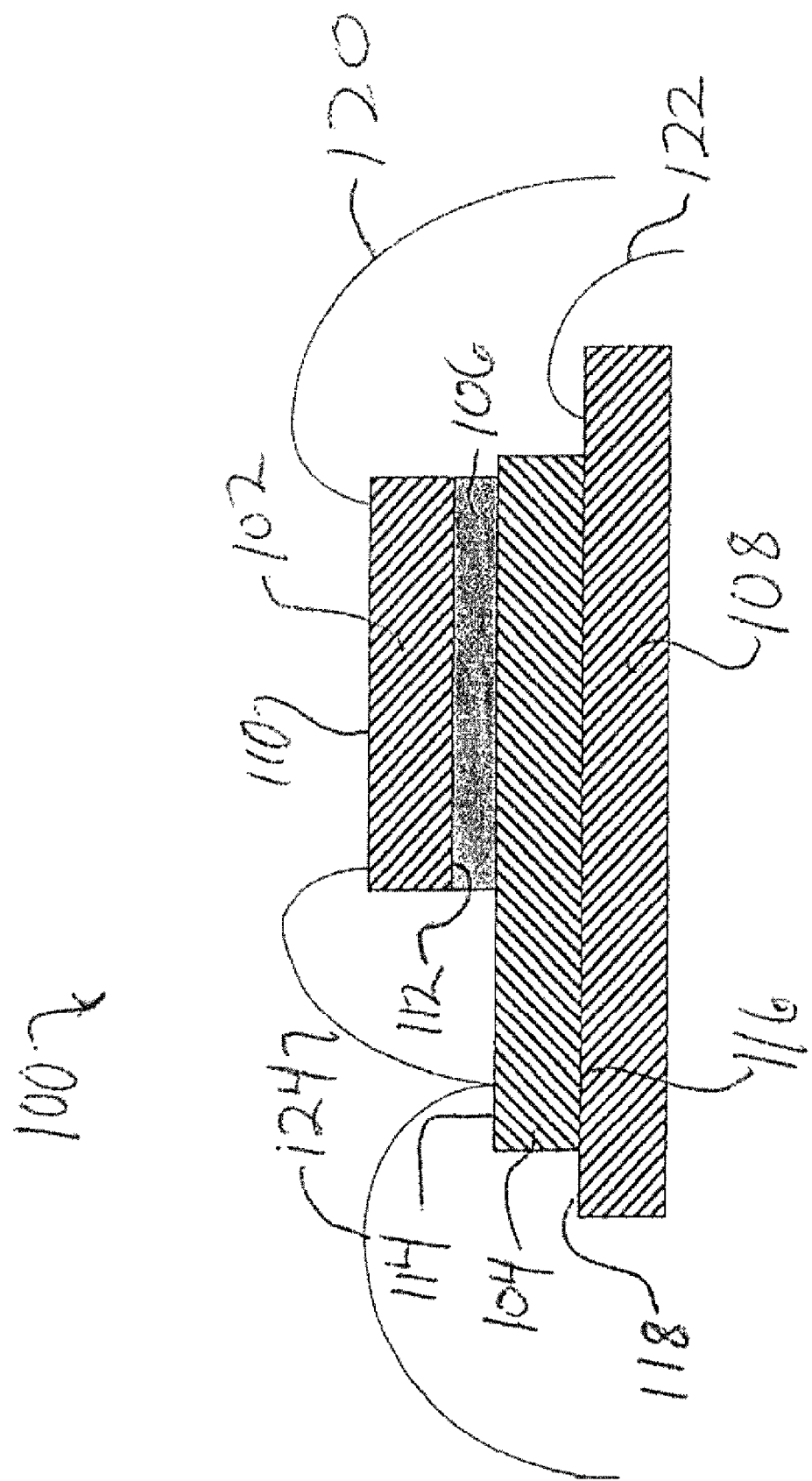
FIG. 2 is a sectional view of the high temperature operating package of the second embodiment.
Figure 3:
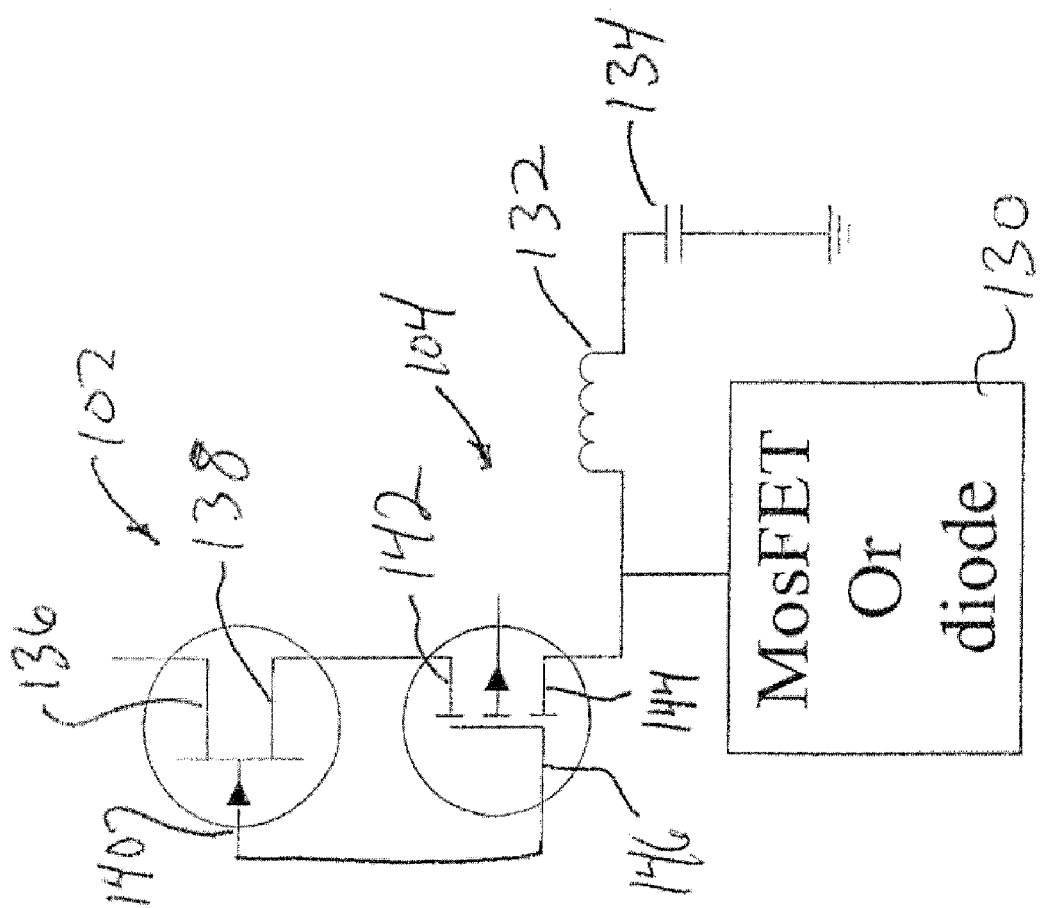
FIG. 3 is an example circuit diagram of a circuit according to the package of FIG. 2.

FIGS. 2 and 3 illustrate a second embodiment of the invention comprising a package 100 having a high temperature die 102 stacked on a series die 104 with a thermal resistance layer 106 therebetween. The series die 104 is attached to a die pad 108. In the illustrated configuration, the high temperature die 102 is a field effect transistor, such as a SiC JFET, with a first surface 110 and a second surface 112. The first surface 110 includes one or more source terminals and one or more gate terminals. The second surface 112 includes one or more drain terminals. The series die 104 operates at a lower, more conventional temperature with the heat generated by the operation of the series die 104 being dissipated by the PCB via the die pad 108. The series die 104 is thus a lower temperature operating device, such as a Si JFET, with a top surface 114 and a bottom surface 116. The top surface 114 includes one or more gate terminals and one or more source terminals. The bottom surface 116 includes one or more drain terminals.

The high temperature die 102 and the series die 104 are connected in series such that the drain terminals of the high temperature die 102 are in electrical communication with the source terminals of the series die 104 via the thermal resistance layer 106. The thermal resistance layer 106 is thus an electrically conductive and thermally resistant material, such as a thick layer of an electrically conductive epoxy with high thermal resistance or a tungsten layer. The bottom surface 116 is attached to a die attach surface 118 of the die pad 108 such that the drain terminals of the series die 104 are in electrical communication with the die pad 108. The series die 104 also conducts heat to the die pad 108 in order to dissipate the heat generated by the series die 104 to the PCB.

One or more bond wires 120 provide electrical communication between the source terminals of the high temperature die 102 and one or more leads (not shown). The bond wire 120 provides a poor thermal path, though the source terminal may be alternatively connected to a device or a lead via a thermal resistance layer. Similarly, one or more bond wires 122 provide electrical communication between the die pad 108 and one or more leads (not shown), thus electrically connecting the drain of the series die 104 to the terminal. The gate terminals of the high temperature die 102 and the series die 104 are in electrical communication with a common gate drive via bond wires 124, which are bonded to one or more leads (not shown). The order of activation of the switches is controlled by the threshold voltages of each device wherein the high temperature die 102 has a higher threshold voltage than the series die 104. Alternatively, the devices may have separate gate drives and a timing circuit controls the activation and deactivation of the switches.

The package 100 includes an encapsulant (not shown) and may be configured with external leads or in a molded leadless package configuration.

FIG. 3 is a circuit diagram illustrating an example circuit according to the second embodiment of the invention. The circuit is a DC buck converter with a MOSFET or diode 130 as well as an inductor 132 and a capacitor 134 in connection with ground. The power switching is provided by the package 100, wherein the high temperature die 102 includes a source 136, a drain 138, and a gate 140, and the series die 104 includes a source 142, a drain 144, and a gate 146. It should be noted that the package 100 illustrated in FIG. 2 may be used in any switching operation, such as the buck converter described here or an amplifier.

In operation, the gate drive increases the voltage on both the gate 146 and the gate 140. Since the series die 104 has the lower threshold voltage, it will be activated before the high temperature die 102. For example, the series die 104 may have a threshold voltage of 2 volts and the high temperature die 102 may have a threshold voltage of 4 volts. Certain applications with larger gates, however, will require a lager difference in threshold voltages. A smaller difference in threshold voltages, such as 0.5 volts may be used in applications requiring fast switching. Once the high temperature device 102 is activated subsequently to the series device 104, the power switch is closed. The power switch is opened when the gate drive lowers the voltage to the gates 140 and 146. The high temperature device 102 deactivates first and opens the switch. The series device 104 deactivates when the gate drive continues to lower the voltage to the gates to thereby prevent cut off any possible leakage current.

This configuration is beneficial because SiC devices have been shown to have good switch performance on the high side, though they tend to leak current more readily than is desired. Since the series device 104 is a Si device and it is only switched on just before the high temperature device 102 and is switched of just after the high temperature device 102, the series device 104 prevents the high temperature device 104 from leaking current. Also because the series device 104 is activated before the high voltage device 102 and deactivated after it, the high voltage switching is controlled by the high temperature device 102. Further, the thermal resistance layer 106 thermally isolates the high temperature device 102 from the series device 104 such that the high temperature device 102 does not dissipate heat to the PCB and thus operates at a higher temperature. Therefore the circuit designer may take advantage of the good switching performance provided by silicon carbide without damaging the other components of the circuit with the elevated temperatures.

It should be noted that one may also stack field effect transistors electrically connected in series as shown in the above embodiment without the thermal resistance layer 106. The top FET is attached to the bottom FET with an electrically conductive material with a relatively low thermal resistance, such as solder. This configuration allows the circuit to be designed with the benefits described above without electrically isolating one of the devices.

In an alternative embodiment, further semiconductor devices may be stacked in addition to the two devices described in the second embodiment. A thermal resistance layer may be included between devices to thermally isolate one device from another. In a further alternative embodiment, the SiC FET (the high temperature device 102), the Si FET (the series device 104), or both are replaced by an integrated circuit (IC). In this embodiment, two or more devices are stacked with a thermal resistance layer therebetween wherein the thermal resistance layer is also not electrically conductive.

While the invention has been described with reference to preferred embodiments, it will be understood by those skilled in the art that various changes may be made and equivalents may be substituted for elements thereof to adapt to particular situations without departing from the scope of the invention. Therefore, it is intended that the invention not be limited to the particular embodiments disclosed as the best mode contemplated for carrying out this invention, but that the invention will include all embodiments falling within the scope and spirit of the appended claims.

The invention claimed is:

1. A semiconductor device comprising:
   a high temperature power device operating at a first temperature and having a first die top surface and a first die bottom surface;
   a power device operating at a second temperature substantially less than the first temperature and having a second die top surface and a second die bottom surface, the second die top surface facing the first die bottom surface;
   control means for turning off the high temperature device before turning off the power device and for turning on the power device before turning on the high temperature device, and
   a thermal resistance layer between the high temperature power device and the power device, the thermal resistance layer providing an electrical connection between at least a portion of the second die top surface and at least a portion of the first die bottom surface.

2. The semiconductor device of claim 1, wherein the high temperature power device has a leakage current, and the control means is operable to control the leakage current.

3. The semiconductor device of claim 1, further comprising:
   a drain terminal of the high temperature power device on the first die bottom surface; and
   a source terminal of the power device on the second die top surface, wherein the thermal resistance layer provides an electrical connection between the drain terminal and the source terminal.

4. The semiconductor device of claim 3, further comprising:
   a first gate terminal of the high temperature power device on the first die top surface;
   a second gate terminal of the power device on the second die top surface; and a common gate connection providing an electrical connection to the second gate terminal and the first gate terminal.

5. A semiconductor device comprising:
a high temperature power device having a first die top surface and a first die bottom surface;
a power device having a second die top surface and a second die bottom surface, the second die top surface facing the first die bottom surface; and
a thermal resistance layer between the high temperature power device and the power device, the thermal resistance layer providing an electrical connection between at least a portion of the second die top surface and at least a portion of the first die bottom surface;
a first gate terminal of the high temperature power device on the first die top surface;
a second gate terminal of the power device on the second die top surface; and
a gate timing circuit electrically connected to the first gate terminal and electrically connected to the second gate terminal, the gate timing circuit to control activation and deactivation of the high temperature power device and the power device.

6. A semiconductor device comprising:
a high temperature power device having a first die top surface and a first die bottom surface;
a power device having a second die top surface and a second die bottom surface, the second die top surface facing the first die bottom surface; and
a thermal resistance layer between the high temperature power device and the power device, the thermal resistance layer providing an electrical connection between at least a portion of the second die top surface and at least a portion of the first die bottom surface,
wherein the power device has a lower voltage threshold than the high temperature power device.

7. The semiconductor device of claim 1, wherein the high temperature power device comprises silicon carbide.

8. The semiconductor device of claim 1, wherein the thermal resistance layer comprises an electrically conductive epoxy.

9. The semiconductor device of claim 1, wherein the thermal resistance layer comprises tungsten.

10. The semiconductor device of claim 1 wherein the first temperature is approximately 200° C. or more and the second temperature is less than 100° C.

11. The semiconductor device of claim 1 wherein the control means comprises a power device with a threshold voltage less than the threshold voltage of the high temperature power device.

12. The semiconductor device of claim 1 wherein the control means comprises gate timing circuit for controlling the activation and the deactivation of said first die and said second die.

* * * * *